United States Patent
Dai et al.

(10) Patent No.: US 11,404,586 B1
(45) Date of Patent: Aug. 2, 2022

(54) TRANSISTORS WITH ENHANCED DOPANT PROFILE AND METHODS FOR FORMING THE SAME

(71) Applicant: Taiwan Semiconductor Manufacturing Company Limited, Hsinchu (TW)

(72) Inventors: Min-Kun Dai, Hsinchu (TW); I-Cheng Chang, Hsinchu (TW); Cheng-Yi Wu, Taichung (TW); Han-Ting Tsai, Kaoshiung (TW); Tsann Lin, Hsinchu (TW); Chung-Te Lin, Tainan (TW); Wei-Gang Chiu, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/173,418

(22) Filed: Feb. 11, 2021

(51) Int. Cl.
*H01L 29/786* (2006.01)
*H01L 29/66* (2006.01)
*H01L 21/02* (2006.01)
*H01L 21/425* (2006.01)

(52) U.S. Cl.
CPC .... *H01L 29/7869* (2013.01); *H01L 21/02565* (2013.01); *H01L 21/425* (2013.01); *H01L 29/66969* (2013.01); *H01L 29/78618* (2013.01); *H01L 29/78696* (2013.01)

(58) Field of Classification Search
CPC ......... H01L 21/02518; H01L 21/02521; H01L 21/02565; H01L 21/02584; H01L 21/40; H01L 21/425; H01L 21/823412; H01L 21/823807; H01L 27/1214; H01L 27/1222; H01L 27/1225; H01L 27/1248; H01L 27/127; H01L 29/66007; H01L 29/66969; H01L 29/786; H01L 29/78618; H01L 29/7869; H01L 29/78696; C23C 14/22; C23C 14/48
See application file for complete search history.

(56) References Cited

U.S. PATENT DOCUMENTS

2015/0016585 A1* 1/2015 Toyotaka .............. G02F 1/1334
377/77

\* cited by examiner

*Primary Examiner* — Cheung Lee
(74) *Attorney, Agent, or Firm* — The Marbury Law Group, PLLC

(57) ABSTRACT

A planar insulating spacer layer is formed over a substrate, and a vertical stack of a gate electrode, a gate dielectric layer, and a first semiconducting metal oxide layer may be formed thereabove. The first semiconducting metal oxide layer includes atoms of a first n-type dopant at a first average dopant concentration. A second semiconducting metal oxide layer is formed over the first semiconducting metal oxide layer. Portions of the second semiconducting metal oxide layer are doped with the second n-type dopant to provide a source-side n-doped region and a drain-side n-doped region that include atoms of the second n-type dopant at a second average dopant concentration that is greater than the first average dopant concentration. Various dopants may be introduced to enhance performance of the thin film transistor.

20 Claims, 16 Drawing Sheets

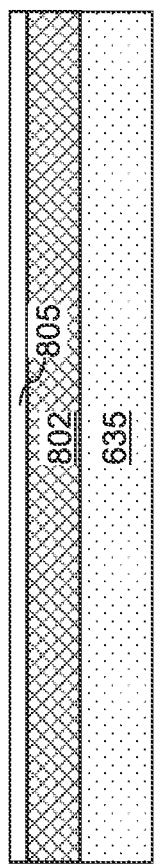
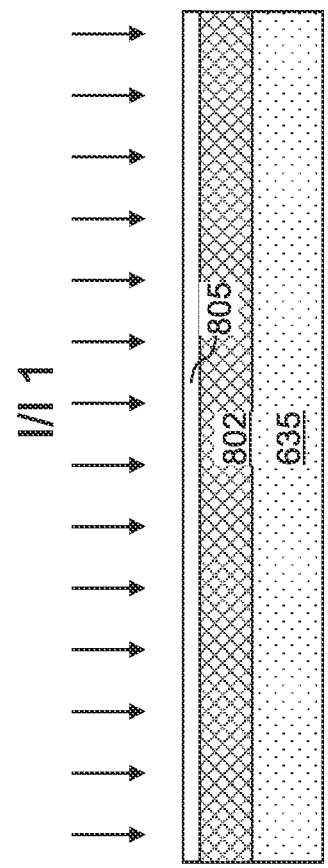

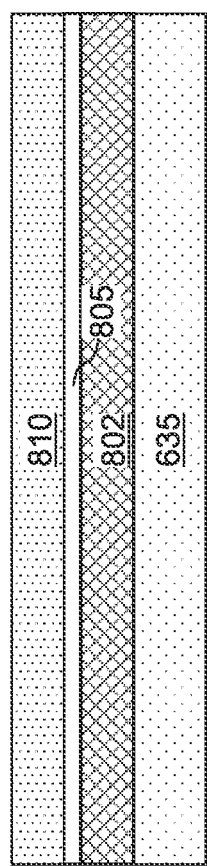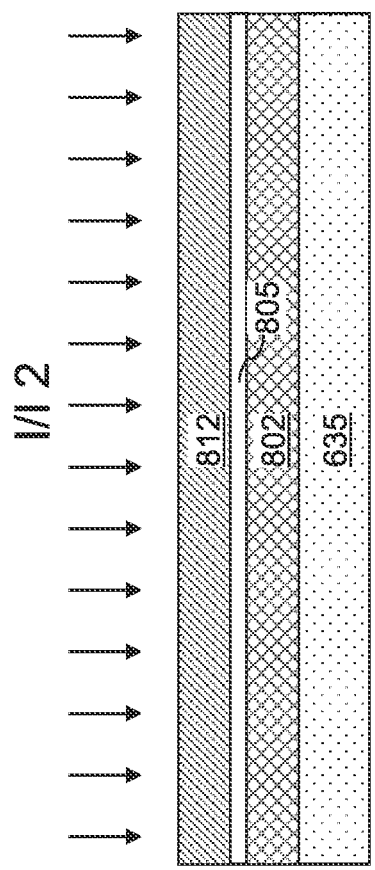

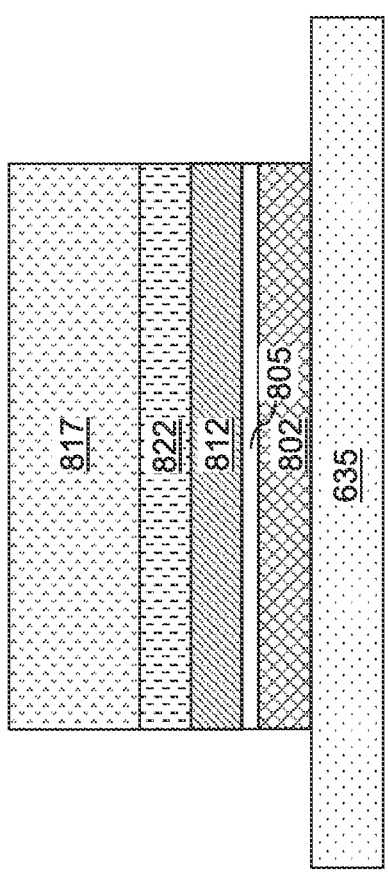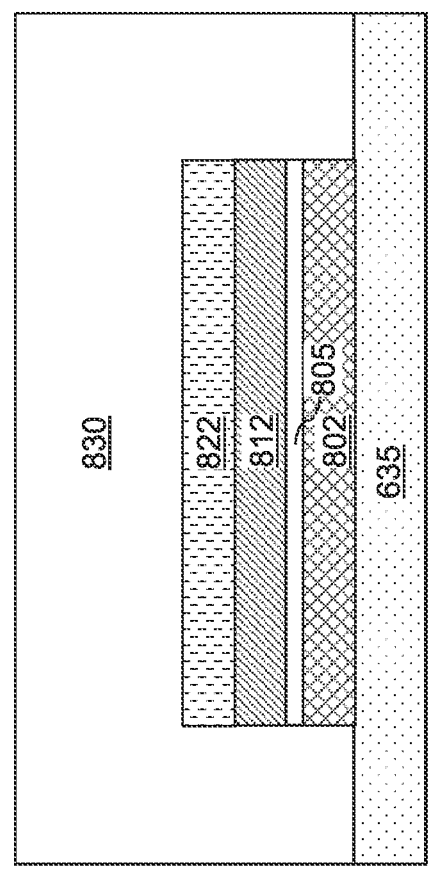

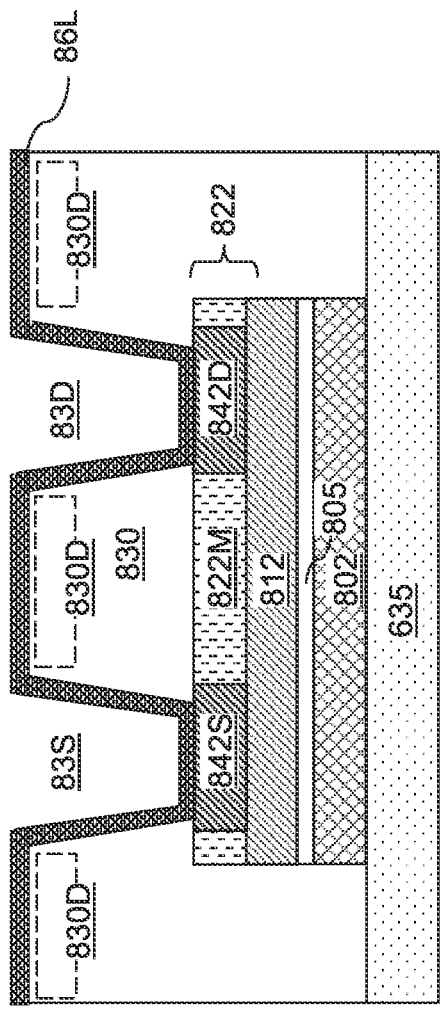
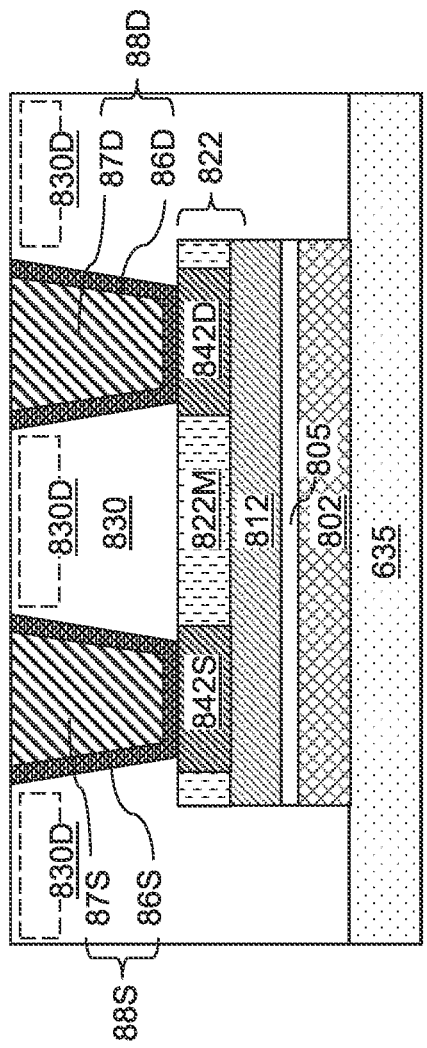

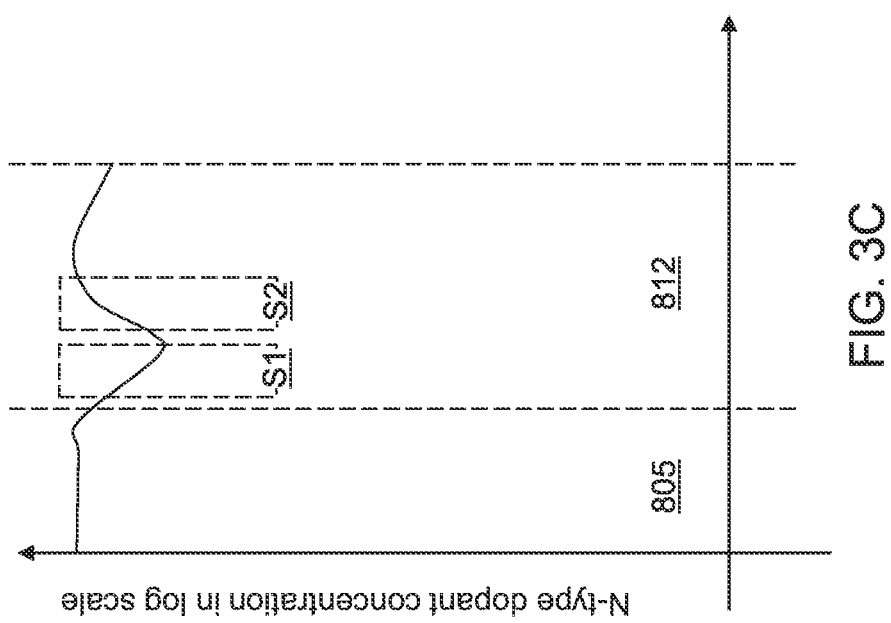

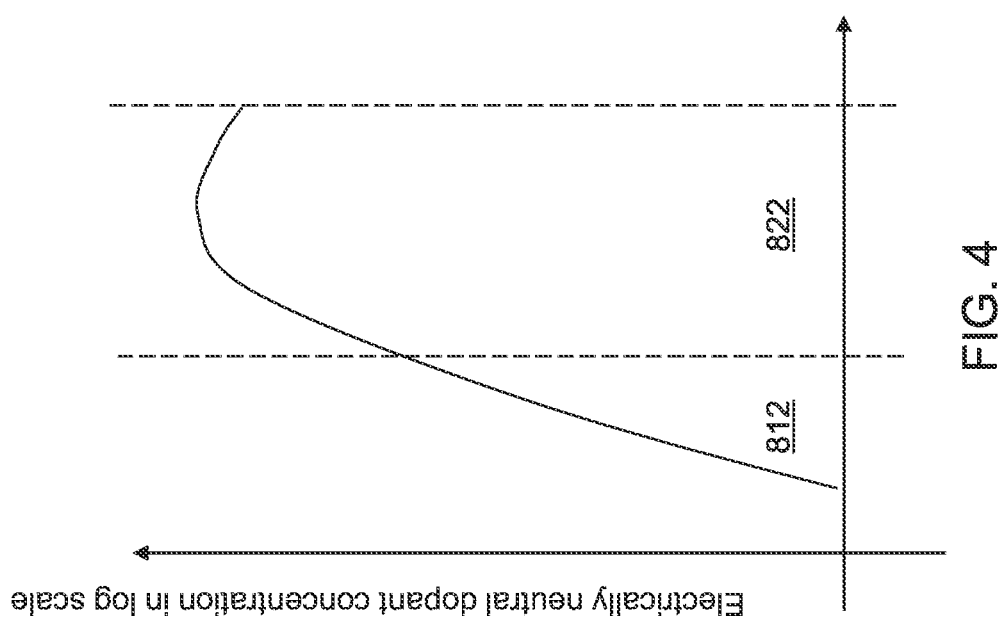

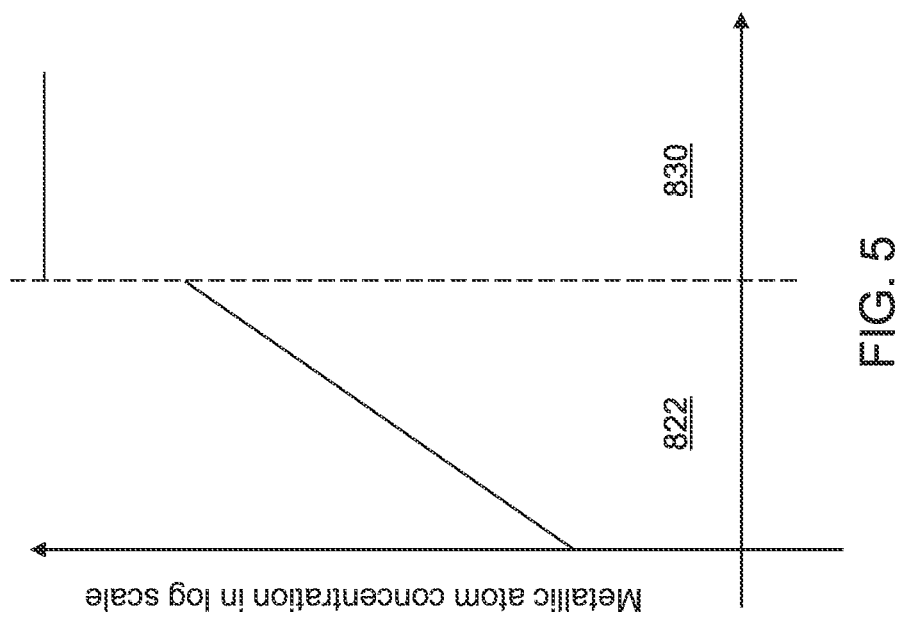

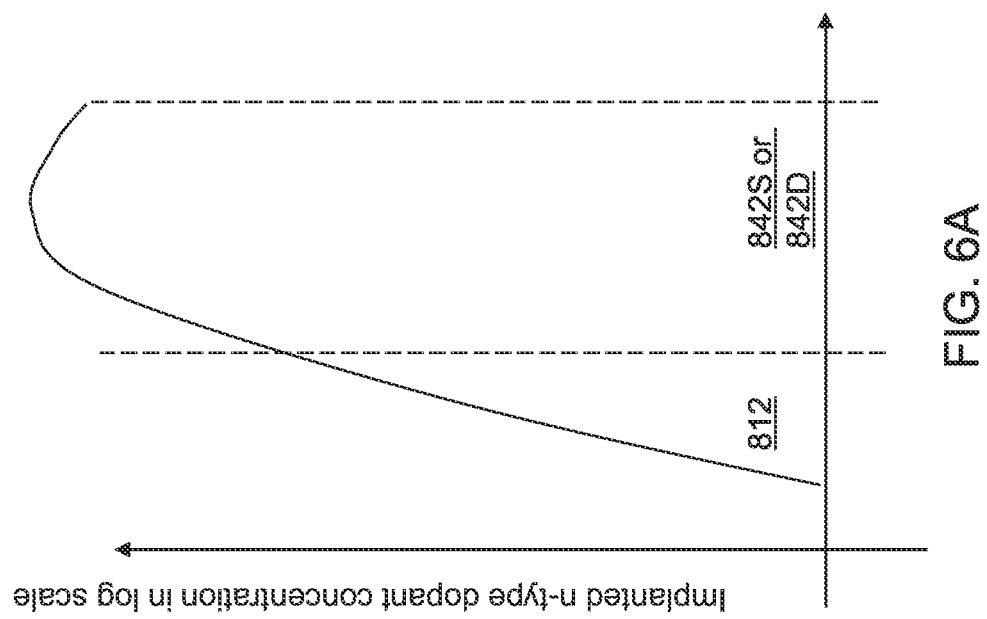

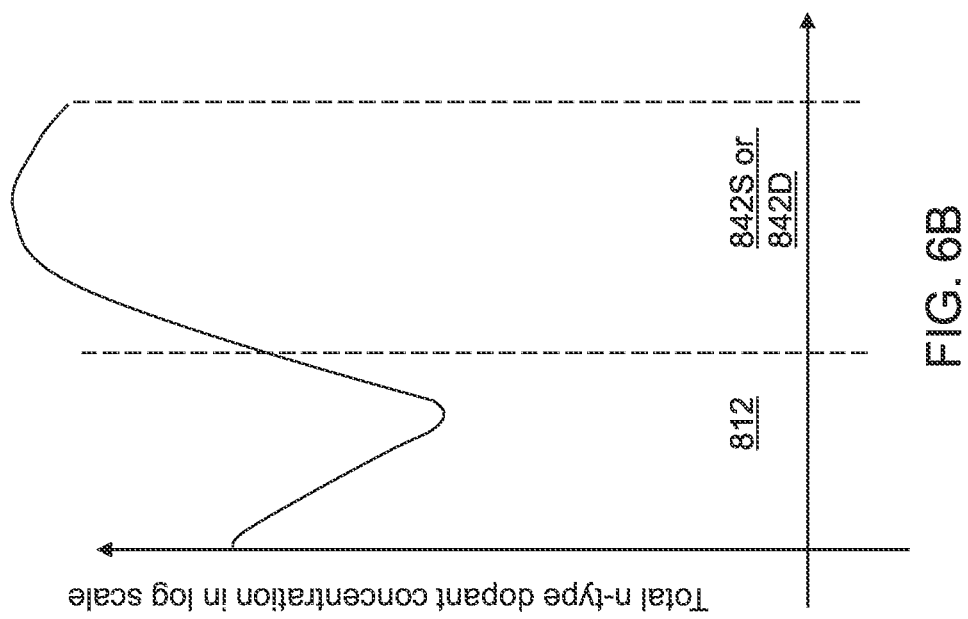

TRANSISTORS WITH ENHANCED DOPANT PROFILE AND METHODS FOR FORMING THE SAME

BACKGROUND

Transistors, and in particular thin-film transistors (TFTs), made of oxide semiconductors are an attractive option for BEOL integration since such transistors may be processed at low temperatures and thus, will not damage previously fabricated devices. For example, the fabrication conditions and techniques may not damage previously fabricated FEOL devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A-2L are sequential vertical cross-sectional views of a portion of the exemplary structure during formation of a thin film transistor structure according to an embodiment of the present disclosure.

FIG. 3C is a dopant concentration profile for n-type dopants in a first semiconducting metal oxide layer that may be provided by outdiffusing atoms of a first n-type dopant from a gate dielectric layer into the first semiconducting metal oxide layer and by implanting additional atoms of the first n-type dopant into the first semiconducting metal oxide layer according to an embodiment of the present disclosure.

FIG. 4 is a dopant concentration profile for electrically neutral dopants in a second semiconducting metal oxide layer that may be provided by implanting the electrically neutral dopants into the second semiconducting metal oxide layer according to an embodiment of the present disclosure.

FIG. 5 is a dopant concentration profile for a metallic dopant in the second semiconducting metal oxide layer that may be provided by outdiffusion of the metallic dopant from the dielectric cap passivation layer into the second semiconducting metal oxide layer according to an embodiment of the present disclosure.

FIG. 6A is a dopant concentration profile for n-type dopants in a source-side n-doped region or a drain-side n-doped region that may be provided by implanting a second n-type dopant into the second semiconducting metal oxide layer according to an embodiment of the present disclosure.

FIG. 6B illustrates a total n-type dopant concentration profile for a source-side n-doped region or a drain-side n-doped region after the processing steps of FIG. 2J in case the dopant profile illustrated in FIG. 3A is present within the first semiconducting metal oxide layer prior to the processing steps of FIG. 2J.

DETAILED DESCRIPTION

Figure 1:
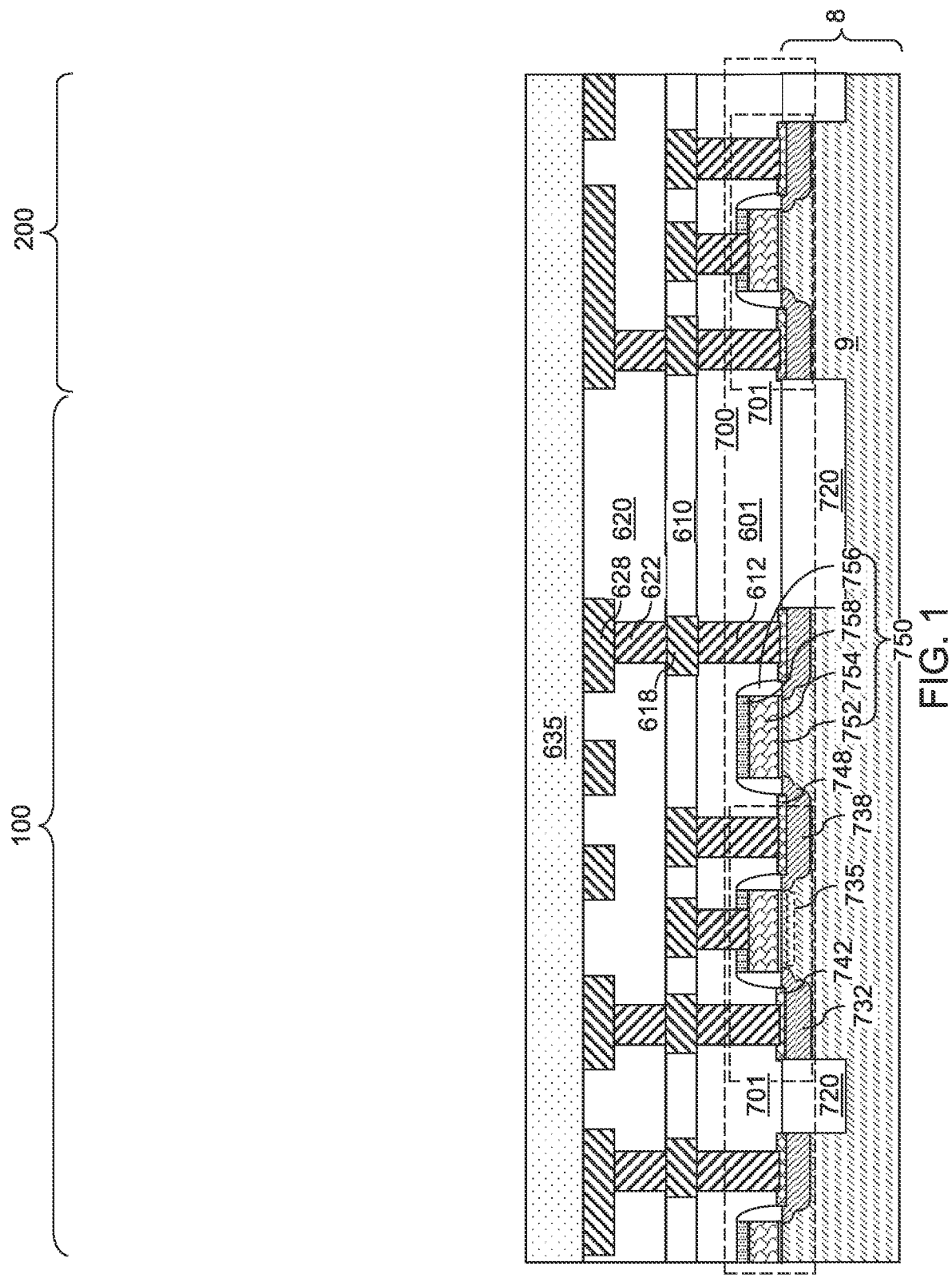
FIG. 1 is a vertical cross-sectional view of an exemplary structure after formation of complementary metal-oxide-semiconductor (CMOS) transistors, first metal interconnect structures formed in lower-level dielectric material layers, and an isolation dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including transistors. Embodiments of the present disclosure may be used to enhance performance and improve device stability for metal oxide semiconductor transistors. In particular, various embodiments are disclosed that describe thin film transistors that use a semiconducting metal oxide material as a channel. Embodiments of the present disclosure use surface doping and/or high-k dielectric passivation in a manner that reduces oxygen vacancy and increases charge carrier concentration.

Reduction in the leakage current and enhancement in the electrical and thermal stability are desirable characteristics for metal oxide semiconductor transistors. For example, metal oxide semiconductor thin-film transistors are particularly susceptible to these issues. The leakage current and the electrical and thermal stability may be profoundly sensitive to oxygen vacancies in the active layer (i.e., in the semiconductor channel), and to ambient water vapor and oxygen molecules. In many cases, the instability in the electrical and thermal performance of the transistors may be due to trap defects formed at the active layer-gate dielectric layer interface. Thus, passivating the oxygen vacancy defect states at the active layer-gate dielectric layer interface and on the back-channel layer allows for the maintenance of good stability and enhances overall device electrical performance.

Further, the contact resistance between source/drain electrodes and active channel depends not only on the work function of the source/drain electrodes, but also on the chemical states at the interface. These chemical states may be modified due to chemical reactions during electrode deposition. For example, some studies have shown evidence of the formation of oxide interlayers (such as tantalum oxide or aluminum oxide between metal oxide semiconductor materials and Ti or Al electrodes), which leads to high contact resistance. In addition, a high density of oxygen deficiencies in the back channel may cause high leakage current.

According to an aspect of the present disclosure, n-type dopants, electrically neutral dopants, and/or a high-k dielectric cap passivation layer may be integrated into a metal oxide semiconductor transistor, which may provide reduced leakage current, reduced source/drain metal contact resistance, and improved device stability under electrical bias stress and under thermal cycling. Thus, the metal oxide semiconductor transistor may provide enhanced performed over conventional transistors. The various aspects of the present disclosure are described in detail herebelow. Various embodiments are disclosed herein that incorporate n-type dopants, electrically neutral dopants, and/or a high-k dielectric cap passivation layer into metal oxide semiconductor thin-film transistors to provide improved device stability under electrical bias stress and under thermal cycling.

FIG. 1 is a vertical cross-sectional view of an exemplary structure after formation of complementary metal-oxide-semiconductor (CMOS) transistors, first metal interconnect structures formed in lower-level dielectric material layers, and an isolation dielectric layer according to an embodiment of the present disclosure.

Referring to FIG. 1, an exemplary structure according to an embodiment of the present disclosure is illustrated. The exemplary structure includes a substrate 8, which may be a semiconductor substrate such as a silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source region 732, a drain region 738, a semiconductor channel 735 that includes a surface portion of the substrate 8 extending between the source region 732 and the drain region 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a memory array region 100 in which an array of memory cells may be subsequently formed. The exemplary structure may further include a peripheral region 200 in which metal wiring for the array of memory devices is provided. Generally, the field effect transistors 701 in the CMOS circuitry 700 may be electrically connected to an electrode of a respective memory cell by a respective set of metal interconnect structures.

Devices (such as field effect transistors 701) in the peripheral region 200 may provide functions that operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective memory cell to be subsequently formed. For example, a plurality of field effect transistors 701 in the CMOS circuitry 700 may include a respective source region 732 or a respective drain region 738 that is subsequently electrically connected to a node of a respective memory cell to be subsequently formed.

In one embodiment, the subsequently formed array of memory cells may be an array of ferroelectric memory cells and the respective select transistors for each respective ferroelectric memory cell may be a thin-film transistor. In this embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process. While the present disclosure is described using an embodiment in which an array of memory cells formed over the second line-and-via-level dielectric material layer 620, embodiments are expressly contemplated herein in which the array of memory cells may be formed at a different metal interconnect level.

An array of thin film transistors and an array of memory cells may be subsequently deposited over the dielectric material layers (601, 610, 620) that have formed therein the metal interconnect structures (612, 618, 622, 628). The set of all dielectric material layer that are formed prior to formation of an array of thin film transistors or an array of ferroelectric memory cells is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, thin film transistors (TFTs) may be formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as a planar insulating spacer layer 635. The planar insulating spacer layer 635 includes a dielectric material such as undoped silicate glass, a doped silicate glass, organosilicate glass, or a porous dielectric material, and may be deposited by chemical vapor deposition. The thickness of the planar insulating spacer layer 635 may be in a range from 30 nm to 300 nm, although lesser and greater thicknesses may also be used.

Generally, interconnect-level dielectric layers (such as the lower-level dielectric material layer (601, 610, 620)) containing therein the metal interconnect structures (such as the first metal interconnect structures (612, 618, 622, 628)) may be formed over semiconductor devices. The planar insulating spacer layer 635 may be formed over the interconnect-level dielectric layers.

FIG. 2A-2L are sequential vertical cross-sectional views of a portion of the exemplary structure during formation of a thin film transistor structure according to an embodiment of the present disclosure.

Referring to FIG. 2A, a portion of the exemplary structure is illustrated. A conductive material layer may be deposited over the planar insulating layer 635 to form a gate electrode 802. The gate electrode 802 may be formed as a blanket material layer (i.e., an unpatterned material layer) at this step, and may be subsequently patterned as needed. The conductive material of the gate electrode 802 may include any gate electrode material, such as at least one metallic material and/or a heavily doped semiconductor material. In one embodiment, the conductive material of the gate electrode 802 may include La, Hf, Ta, Zr, In, Cd, Ag, Al, Nb, Zn, Sn, Cr, W, Mo, Ru, Ti, Os, Rh, Ru, Ir, and/or Pt. Other suitable conductive materials are within the contemplated scope of disclosure. The gate electrode 802 may be deposited by a conformal or non-conformal deposition process, such as chemical vapor deposition and/or physical vapor deposition. The thickness of the gate electrode 802 may be in a range from 30 nm to 600 nm, such as from 60 nm to 300 nm, although lesser and greater thicknesses may also be used.

A gate dielectric layer 805 may be deposited over the gate electrode 802. In one embodiment, the gate dielectric layer 805 includes a dielectric metal oxide material. Exemplary dielectric metal oxide materials include, but are not limited to, aluminum oxide, hafnium oxide, yttrium oxide, lanthanum oxide, zirconium oxide, tantalum oxide, etc. Other suitable dielectric materials are within the contemplated scope of disclosure. The gate dielectric layer 805 may be deposited by atomic layer deposition (ALD), chemical vapor deposition (CVD), and/or physical vapor deposition (PVD). The thickness of the gate dielectric layer 805 may be in a range from 1 nm to 12 nm, such as from 2 nm to 6 nm, although lesser and greater thicknesses may also be used.

Referring to FIG. 2B, a first ion implantation process "I/I 1" may be optionally performed to implant atoms of a first n-type dopant into the deposited dielectric metal oxide material of the gate dielectric layer 805. In one embodiment, the first n-type dopant may comprise a halide species selected from F, Cl, Br, and I. Other suitable sources of first n-type dopants may be within the contemplated scope of disclosure. The dose of the first n-type dopant during the first ion implantation process may be in a range from $1.0 \times 10^{13}/$ $cm^2$ to $1.0 \times 10^{61}/cm^2$, such as from $1.0 \times 10^{14}/cm^2$ to $1.0 \times 10^{15}/cm^2$, although lesser and greater doses may also be used.

Referring to FIG. 2C, a first semiconducting metal oxide layer 810 may be deposited over the gate dielectric layer 805 by depositing a semiconducting metal oxide material. A semiconducting material is a material having electrical conductivity in a range from $1.0 \times 10^{-5}$ S/m to $1.0 \times 10^{5}$ S/m. In an intrinsic state or under a condition of a low-level electrical doping, a semiconductor material may be semiconducting or insulating, and may have electrical conductivity generally in a range from $1.0 \times 10^{-10}$ S/m to $1.0 \times 10^{5}$ S/m. A metal oxide semiconducting material is a semiconducting material composed primarily of a semiconducting metal oxide. Exemplary semiconducting metal oxide materials that may be used for the first semiconducting metal oxide layer 810 include, but are not limited to, indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. Other suitable semiconducting materials are within the contemplated scope of disclosure. In one embodiment, the semiconducting metal oxide material may include indium gallium zinc oxide.

The first semiconducting metal oxide layer 810 may include a polycrystalline semiconducting material, or an amorphous semiconducting material that may be subsequently annealed into a polycrystalline semiconducting material having a greater average grain size. The first semiconducting metal oxide layer 810 may be deposited by physical vapor deposition. The thickness of the semiconducting material may be in a range from 1 nm to 100 nm, such as from 2 nm to 50 nm and/or from 4 nm to 15 nm, although lesser and greater thicknesses may also be used.

Figure 2E:
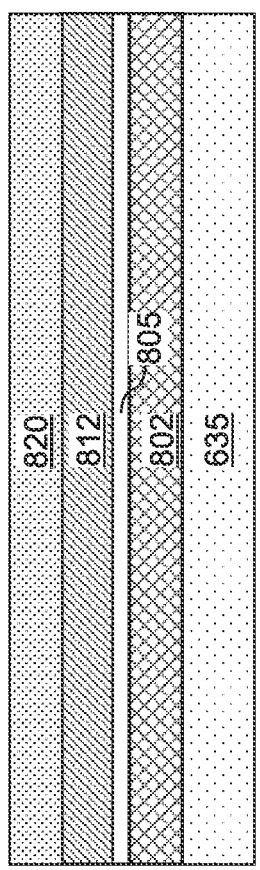
Figure 3B:
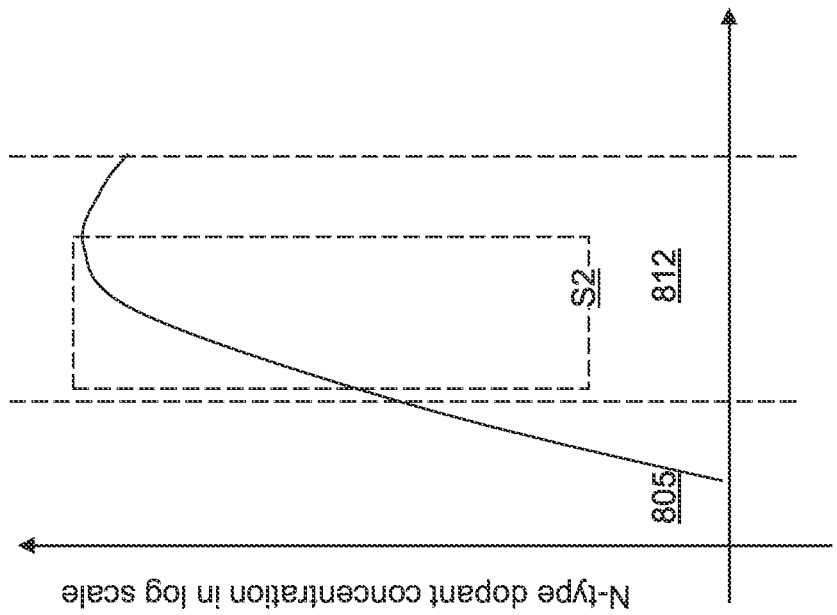
FIG. 3B is a dopant concentration profile for n-type dopants in a first semiconducting metal oxide layer that may be provided by implanting atoms of a first n-type dopant into the first semiconducting metal oxide layer according to an embodiment of the present disclosure.
Figure 3A:
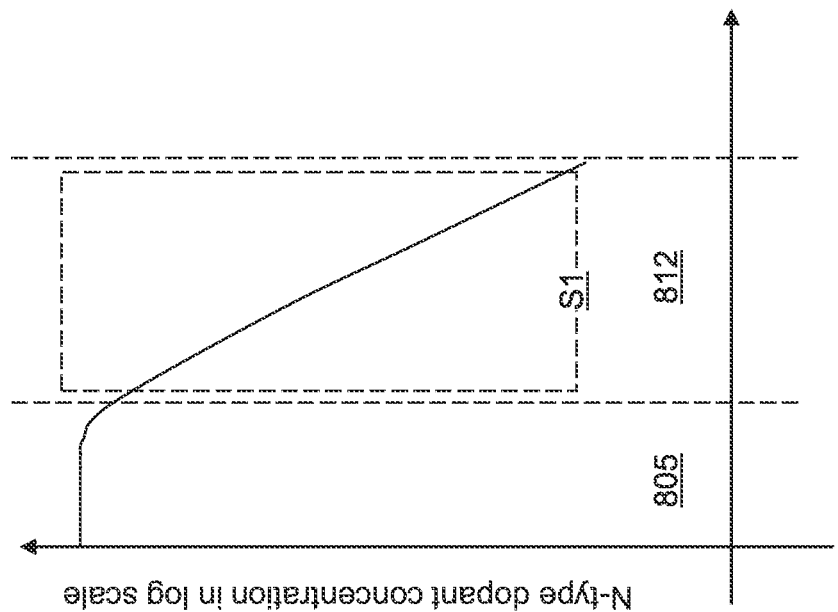
FIG. 3A is a dopant concentration profile for n-type dopants in a first semiconducting metal oxide layer that may be provided by outdiffusing atoms of a first n-type dopant from a gate dielectric layer into the first semiconducting metal oxide layer according to an embodiment of the present disclosure.

Referring to FIGS. 2D and 3A, an anneal process may be performed to outdiffuse the atoms of the first n-type dopant from the gate dielectric layer 805 into the first semiconducting metal oxide layer 810. The first semiconducting metal oxide layer 810 as doped by the atoms of the first n-type dopant is herein referred to as a first semiconducting metal oxide layer 812. The first semiconducting metal oxide layer 812 is a first doped semiconducting metal oxide layer 812. FIG. 3A is a first dopant concentration profile for first n-type dopant in the first semiconducting metal oxide layer 812, which is provided by outdiffusing the first n-type dopant from the gate dielectric layer 805 into the first semiconducting metal oxide layer 812 according to an embodiment of the present disclosure. In this embodiment, the first semiconducting metal oxide layer 812 may be doped with the atoms of the first n-type dopant at a first average dopant concentration. The first average dopant concentration may be in a range from $1.0 \times 10^{17}/cm^3$ to $1.0 \times 10^{20}/cm^3$, such as from $1.0 \times 10^{18}/cm^3$ to $1.0 \times 10^{19}/cm^3$, although lesser and greater average dopant concentrations may also be used.

Generally, atoms of a first n-type dopant may be implanted into the gate dielectric layer 805 at the processing steps of FIG. 2B, and may be subsequently diffused from the gate dielectric layer 805 into the first semiconducting metal oxide layer 810 by performing an anneal process to form the first semiconducting metal oxide layer 812 containing the atoms of the first n-type dopant. In this embodiment, the gate dielectric layer 805 may comprise additional atoms of the first n-type dopant at an average dopant concentration (which is hereafter referred to as a third average dopant concentration) that is greater than the first average dopant concentration.

In one embodiment, the atomic concentration of the atoms of the first n-type dopant within the first semiconducting metal oxide layer 812 may have a non-uniform vertical concentration profile as illustrated in FIG. 3A. In one embodiment, the atomic concentration of the atoms of the first n-type dopant within the first semiconducting metal oxide layer 812 in the non-uniform vertical concentration profile comprises a segment that decreases with a vertical distance from an interface with the gate dielectric layer 805.

FIG. 3B illustrates a second dopant concentration profile for the first n-type dopants in the first semiconducting metal oxide layer 812 according to an embodiment of the present disclosure. Referring collectively to FIGS. 2D and 3B, the second dopant concentration profile for the first n-type dopants in the first semiconducting metal oxide layer 812 may be provided by omitting the first ion implantation process "I/I 1" of FIG. 2B, and by implanting atoms of the first n-type dopant into the first semiconducting metal oxide layer 812. In other words, the processing steps of FIG. 2C may be performed after the processing steps of FIG. 2A without performing the ion implantation processing steps of FIG. 2B. Subsequently, atoms of the first n-type dopant may be implanted into the first semiconducting metal oxide layer 810 (as provided at the processing steps of FIG. 2C) by performing an ion implantation process, which is herein referred to as a second ion implantation process "I/I 2". Thus, the first ion implantation process "I/I 1" is omitted, and the second ion implantation process "I/I 2" is performed in this embodiment.

The second ion implantation process "I/I 2" may implant atoms of the first n-type dopant into the first semiconducting metal oxide layer 810, thereby forming the first semiconducting metal oxide layer 812. In one embodiment, the first n-type dopant may comprise a halide species selected from F, Cl, Br, and I. The dose of the first n-type dopant during the first ion implantation process may be in a range from $1.0 \times 10^{14}/cm^2$ to $1.0 \times 10^{17}/cm^2$, such as from $2.0 \times 10^{14}/cm^2$ to $5.0 \times 10^{16}/cm^2$, although lesser and greater doses may also be used.

In the embodiment described in the combination of FIGS. 2A, 2C, 2D and 3B, the first semiconducting metal oxide layer 810 may be deposited over the gate dielectric layer 805, and atoms of the first n-type dopant may be implanted into the first semiconducting metal oxide layer 810 using an ion implantation process, thereby forming the first semiconducting metal oxide layer 812. Optionally, an anneal process may be performed to activate atoms of the implanted first n-type dopant in the first semiconducting metal oxide layer 812.

In this embodiment, the first semiconducting metal oxide layer 812 may be doped with the atoms of the first n-type dopant at a first average dopant concentration. The first average dopant concentration may be in a range from $1.0 \times 10^{17}/cm^3$ to $1.0 \times 10^{20}/cm^3$, such as from $1.0 \times 10^{18}/cm^3$ to $1.0 \times 10^{19}/cm^3$, although lesser and greater average dopant concentrations may also be used. In this embodiment, the atomic concentration of the atoms of the first n-type dopant within the first semiconducting metal oxide layer 812 may have a non-uniform vertical concentration profile as illustrated in FIG. 3B. In one embodiment, the atomic concentration of the atoms of the first n-type dopant within the first semiconducting metal oxide layer 812 in the non-uniform vertical concentration profile comprises a segment S2 that increases with a vertical distance from an interface with the gate dielectric layer 805. In one embodiment, the gate dielectric layer 805 is free of the first n-type dopant within the first semiconducting metal oxide layer 812, or includes the first n-type dopant within the first semiconducting metal oxide layer 812 at an atomic concentration that is less than 0.1 times the first average dopant concentration. In one embodiment, the first n-type dopant comprises a halide species selected from F, Cl, Br, and I.

In an alternative embodiment, the first ion implantation process "I/I 1" (schematically illustrated in FIG. 2B) and the second ion implantation process "I/I 2" (schematically illustrated in FIG. 2D) may be performed to introduce atoms of the first n-type dopant into the first semiconducting metal oxide layer 812. FIG. 3C is a dopant concentration profile for the first n-type dopant in the first semiconducting metal oxide layer 812. The dopant concentration profile illustrated in FIG. 3C may be provided by outdiffusing atoms of the first n-type dopant from the gate dielectric layer 805 into the first semiconducting metal oxide layer 812, and by implanting additional atoms of the first n-type dopant into the first semiconducting metal oxide layer 812. An anneal process may be optionally performed to activate the atoms of the first n-type dopant.

In this embodiment, the first semiconducting metal oxide layer 812 may be doped with the atoms of the first n-type dopant at a first average dopant concentration. The first average dopant concentration may be in a range from $1.0 \times 10^{17}/cm^3$ to $1.0 \times 10^{20}/cm^3$, such as from $1.0 \times 10^{18}/cm^3$ to $1.0 \times 10^{19}/cm^3$, although lesser and greater average dopant concentrations may also be used. In this embodiment, the atomic concentration of the atoms of the first n-type dopant within the first semiconducting metal oxide layer 812 may have a non-uniform vertical concentration profile as illustrated in FIG. 3C. In one embodiment, the atomic concentration of the atoms of the first n-type dopant within the first semiconducting metal oxide layer 812 in the non-uniform vertical concentration profile comprises a segment S1 that decreases with a vertical distance from an interface with the gate dielectric layer 805 and a segment S2 that overlies the segment S1 and increases with the vertical distance from the interface with the gate dielectric layer 805. In one embodiment, the first n-type dopant comprises a halide species selected from F, Cl, Br, and I.

Generally, a vertical stack of the gate electrode 802, the gate dielectric layer 805, and the first semiconducting metal oxide layer 812 may be formed over the planar insulating spacer layer 635. The first semiconducting metal oxide layer 812 comprising atoms of the first n-type dopant at the first average dopant concentration.

Referring to FIG. 2E, a second semiconducting metal oxide layer 820 may be formed over the first semiconducting metal oxide layer 812. The second semiconducting metal oxide layer 820 may be formed by depositing a semiconducting metal oxide material, which may be the same as, or may be different from, the semiconducting metal oxide material of the first semiconducting metal oxide layer 812. Exemplary semiconducting metal oxide materials that may be used for the second semiconducting metal oxide layer 820 include, but are not limited to, indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. Other suitable semiconducting materials are within the contemplated scope of disclosure. In one embodiment, the semiconducting metal oxide material may include indium gallium zinc oxide.

The second semiconducting metal oxide layer 820 may include a polycrystalline semiconducting material, or an amorphous semiconducting material that may be subsequently annealed into a polycrystalline semiconducting material having a greater average grain size. The second semiconducting metal oxide layer 820 may be deposited by physical vapor deposition. The thickness of the semiconducting material may be in a range from 1 nm to 100 nm, such as from 2 nm to 50 nm and/or from 4 nm to 15 nm, although lesser and greater thicknesses may also be used.

Figure 2F:
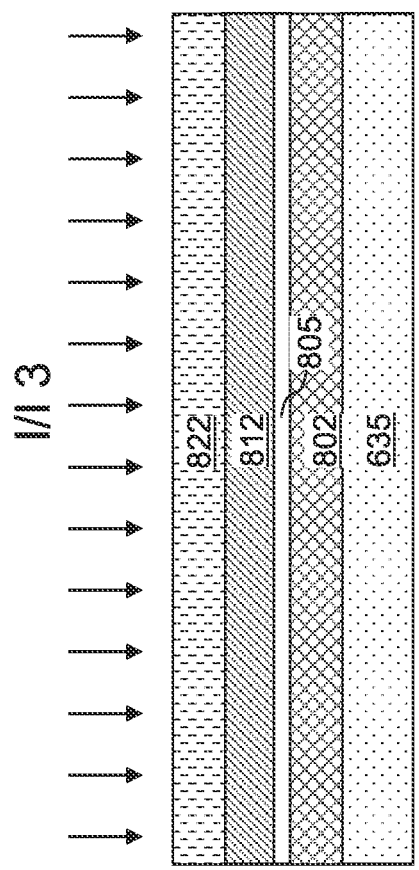

Referring FIG. 2F, a third ion implantation process "I/I 3" may be performed to implant electrically neutral dopants into the second semiconducting metal oxide layer 820. The second semiconducting metal oxide layer 820 as implanted by the electrically neutral dopants is herein referred to as a second semiconducting metal oxide layer 822, which may be a second doped semiconducting metal oxide layer.

The electrically neutral dopants comprise atoms that passivates oxygen deficiency within the second semiconducting metal oxide layer 822. In one embodiment, the electrically neutral dopants passivates oxygen deficiency within the second semiconducting metal oxide layer 822 by occupying locations of the oxygen deficiency. In one embodiment, the electrically neutral dopants comprise atoms of a species selected from He, Ne, Ar, Kr, and N. Other suitable sources of neutral dopants may be within the contemplated scope of disclosure. In one embodiment, the electrically neutral dopants comprise atoms of a noble gas. In another embodiment, the electrically neutral atoms comprise nitrogen atoms. The dose of the electrically neutral dopants during the third ion implantation process "I/I 3" may be from $1.0 \times 10^{13}/cm^2$ to $1.0 \times 10^{16}/cm^2$, such as from $1.0 \times 10^{14}/cm^2$ to $1.0 \times 10^{15}/cm^2$, although lesser and greater doses may also be used.

FIG. 4 is a dopant concentration profile for electrically neutral dopants in the second semiconducting metal oxide layer 822 that may be provided by implanting the electrically neutral dopants into the second semiconducting metal oxide layer 820 at the processing steps of FIG. 2F according to an embodiment of the present disclosure. In one embodiment, the electrically neutral dopants have a non-uniform vertical concentration profile. In one embodiment, the non-uniform vertical concentration profile may have a peak within the second semiconducting metal oxide layer 822. In one embodiment, the non-uniform vertical concentration profile may have a segment that increases with a vertical distance from an interface with the first semiconducting metal oxide layer 812, and a segment that decreases with the vertical distance from the interface with the first semiconducting metal oxide layer 812. The average atomic concentration of the electrically neutral dopants in the second semiconducting metal oxide layer 822 may be in a range from $1.0 \times 10^{19}/cm^3$ to $5.0 \times 10^{21}/cm^3$, such as from $5.0 \times 10^{19}/cm^3$ to $1.0 \times 10^{21}/cm^3$, although lesser and greater average atomic concentrations may also be used.

Referring back to FIG. 2G, a photoresist layer 817 may be applied over the second semiconducting metal oxide layer 822, and may be lithographically patterned to cover each area of a thin film transistor. In one embodiment, the photoresist layer 817 may be patterned into a two-dimensional periodic array of patterned photoresist material portions to define areas of a two-dimensional array of thin film transistors to be subsequently formed.

An anisotropic etch process may be performed to transfer the pattern in the photoresist layer 817 through the stack of the second semiconducting metal oxide layer 822, the first semiconducting metal oxide layer 812, and the gate dielectric layer 805. Sidewalls of the gate dielectric layer 805, sidewalls of the first semiconducting metal oxide layer 812, and the sidewalls of the second semiconducting metal oxide layer 822 may be vertically coincident with one another for each thin film transistor, i.e., may be located within a same set of vertical planes for each thin film transistor.

Optionally, the gate electrode 802 may be patterned with the same pattern as the first semiconducting metal oxide layer 812 and the second semiconducting metal oxide layer 822. In this embodiment, a metal interconnect structure (not illustrated) such as a metal line or a metal via structure may be embedded in the planar insulating spacer layer 635, and may contact a bottom surface of the gate electrode 802. In one embodiment, sidewalls of the gate electrode 802, sidewalls of the gate dielectric layer 805, sidewalls of the first semiconducting metal oxide layer 812, and the sidewalls of the second semiconducting metal oxide layer 822 may be vertically coincident with one another for each thin film transistor. The photoresist layer 817 may be subsequently removed, for example, by ashing.

In an alternative embodiment, the gate electrode 802 may be patterned with a greater area than the stack of the second semiconducting metal oxide layer 822, the first semiconducting metal oxide layer 812, and the gate dielectric layer 805. In this embodiment, a gate electrode contact via structure (not shown) may be subsequently formed on a top surface of a laterally-protruding region of the gate electrode 802 to provide electrical contact to the gate electrode 805.

Referring to FIG. 2H, a dielectric cap passivation layer 830 may be formed over the second semiconducting metal oxide layer 822 after implanting the electrically neutral dopants and after patterning the stack of the second semiconducting metal oxide layer 822, the first semiconducting metal oxide layer 812, the gate dielectric layer 805, and the gate electrode 802. According to an aspect of the present disclosure, the dielectric cap passivation layer 830 may comprise a dielectric metal oxide including a metal that may function as a metallic dopant within the second semiconducting metal oxide layer 822 to reduce the oxygen deficiency defects within the second semiconducting metal oxide layer 822. In one embodiment, the metal that may function as the metallic dopant may be selected from Al, Ga, Hf, and Zr. Other suitable sources of metallic dopants are within the contemplated scope of disclosure.

The dielectric cap passivation layer 830 may be deposited by a conformal or non-conformal deposition process. In one embodiment, the dielectric cap passivation layer 830 may be deposited by chemical vapor deposition or physical vapor deposition. Optionally, the top surface of the dielectric cap passivation layer 830 may be planarized, for example, by chemical mechanical polishing (CMP). The thickness of the dielectric cap passivation layer 830, as measured above the top surface of the second semiconducting metal oxide layer 822, may be in a range from 50 nm to 600 nm, such as from 100 nm to 300 nm, although lesser and greater thicknesses may also be used. In one embodiment, the metal that may function as the metallic dopant may be incorporated into the dielectric cap passivation layer 830 during deposition of the dielectric cap passivation layer 830 by in-situ doping. Alternatively, the metal that may function as the metallic dopant may be incorporated into the dielectric cap passivation layer 830 after deposition of a dielectric metal oxide material of the dielectric cap passivation layer 830 by performing an ion implantation process.

According to an aspect of the present disclosure, the second semiconducting metal oxide layer 822 may be doped with the metal from the dielectric cap passivation layer 830. Specifically, an anneal process may be performed to diffuse atoms of the metal from the dielectric cap passivation layer 830 into the second semiconducting metal oxide layer 822. The elevated temperature of the anneal process may be, for example, in a range from 200 degrees Celsius to 400 degrees Celsius, and the duration of the elevated temperature during the anneal process may be in a range from 10 minutes to 300 minutes, although lower or higher elevated temperatures and/or longer or shorter durations of the elevated temperature may also be used.

FIG. 5 is a dopant concentration profile for metallic dopants (i.e., the metal that diffuses from the dielectric cap passivation layer 830 into the second semiconducting metal oxide layer 822) in the second semiconducting metal oxide layer 822. Generally, the dielectric cap passivation layer 830 may overlie the second semiconducting metal oxide layer 822, and the dielectric cap passivation layer 830 comprises a dielectric metal oxide including a metal such as Al, Ga, Hf, and Zr as a main metallic component of the dielectric metal oxide, or as a dopant. Other suitable metals to serve as the main metallic component of the dielectric metal oxide are within the contemplated scope of disclosure. The metallic dopant in the second semiconducting metal oxide layer 822 may be provided by outdiffusion of the metallic dopant (i.e., the metal such as Al, Ga, Hf, and Zr) from the dielectric cap passivation layer 830 into the second semiconducting metal oxide layer 822 in the anneal process. The second semiconducting metal oxide layer 822 may be doped with the metal at a non-uniform dopant concentration profile, in which an atomic concentration of the metal decreases with a distance from an interface with the dielectric cap passivation layer 830. The average atomic concentration of the metallic dopant (i.e., the metal such as Al, Ga, Hf, and Zr) in the second semiconducting metal oxide layer 822 may be in a range from $1.0 \times 10^{19}/cm^3$ to $5.0 \times 10^{21}/cm^3$, such as from $5.0 \times 10^{19}/cm^3$ to $1.0 \times 10^{21}/cm^3$, although lesser and greater average atomic concentrations may also be used.

Figure 2I:
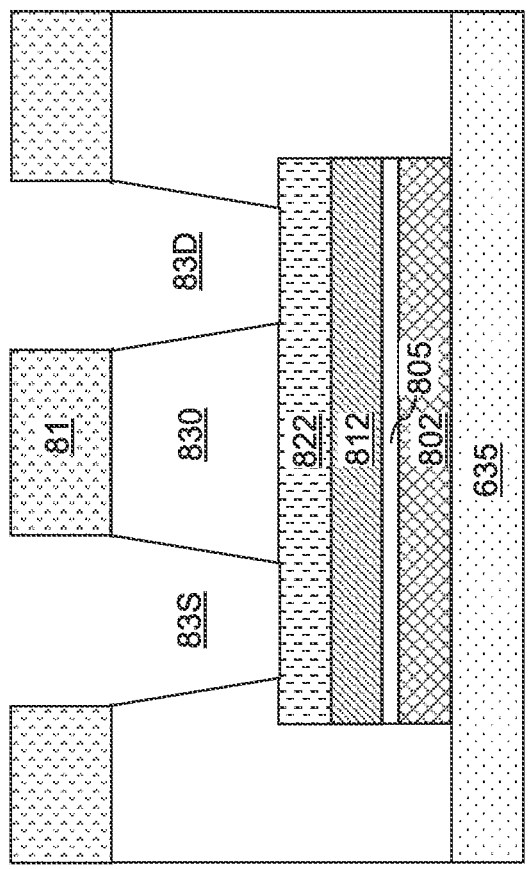

Referring to FIG. 2I, a photoresist layer 81 may be applied over the dielectric cap passivation layer 830, and may be lithographically patterned to form a pair of openings 83S, 83D over each patterned stack of a gate electrode 802, a gate dielectric layer 805, a first semiconducting metal oxide layer 812, and a second semiconducting metal oxide layer 822. One opening 83S may be formed over a first end portion of the patterned stack of a gate electrode 802, a gate dielectric layer 805, a first semiconducting metal oxide layer 812, and a second semiconducting metal oxide layer 822, and another opening 83D may be formed over a second end portion of the patterned stack of the gate electrode 802, the gate dielectric layer 805, the first semiconducting metal oxide layer 812, and the second semiconducting metal oxide layer 822. The two openings 83S, 83D may be laterally spaced from each other by a center portion of the patterned stack of the gate electrode 802, the gate dielectric layer 805, the first semiconducting metal oxide layer 812, and the second semiconducting metal oxide layer 822.

An anisotropic etch process may be performed to transfer the pattern of the openings in the photoresist layer 81 through the dielectric cap passivation layer 830. The anisotropic etch process may be selective to the material of the second semiconducting metal oxide layer 822. A source cavity 83S and a drain cavity 83D may be formed through the dielectric cap passivation layer 830. A top surface of the second semiconducting metal oxide layer 822 may be physically exposed at the bottom of each of the source cavity 83S and the drain cavity 83D. Each of the source cavity 83S and the drain cavity 83D may have a respective straight sidewall, which may include a respective vertical sidewall or a respective tapered sidewall having a taper angle in a range from 0.01 degree to 10 degrees with respect to the vertical direction.

Figure 2J:
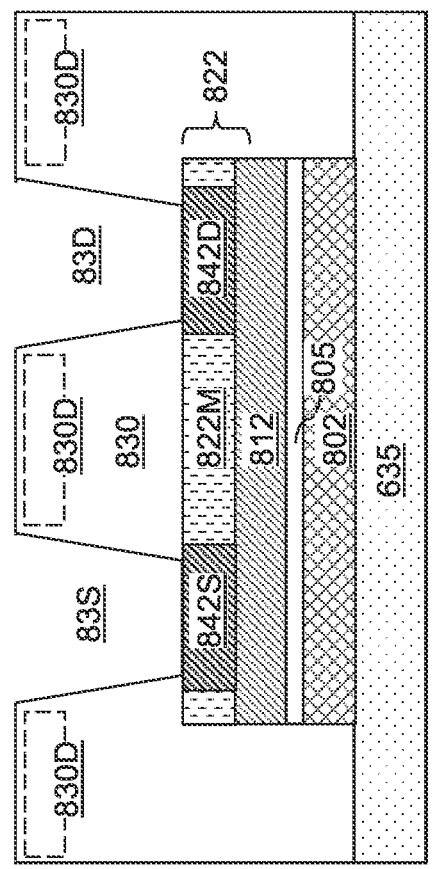

Referring to FIG. 2J, ions of an n-type dopant may be implanted through the source cavity 83S and through the drain cavity 83D into portions of the second semiconducting metal oxide layer 822 that underlie the source cavity 83S and the drain cavity 83D. The n-type dopant implanted into the second semiconducting metal oxide layer 822 is herein referred to as a second n-type dopant. A portion of the second semiconducting metal oxide layer 822 that underlies the source cavity 83S and is doped with the second n-type dopant constitutes a source-side n-doped region 842S. A portion of the second semiconducting metal oxide layer 822 that underlies the drain cavity 83D and is doped with the second n-type dopant constitutes a drain-side n-doped region 842D. An upper portion of the dielectric cap passivation layer 830 may be doped with the same n-type dopants as the source-side n-doped region 842S and the drain-side n-doped region 842D to provide an n-doped dielectric cap passivation material portion 830D.

FIG. 6A is a dopant concentration profile for the implanted second n-type dopant in a source-side n-doped region 842S or in a drain-side n-doped region 842D that are introduced at the processing steps of FIG. 2J. The second n-type dopant may have a non-uniform vertical concentration profile. The source-side n-doped region 842S and the drain-side n-doped region 842D that include atoms of the second n-type dopant at a second average dopant concentration that is greater than the first average dopant concentration. The second average dopant concentration may be in a range from $5.0 \times 10^{19}/cm^3$ to $5.0 \times 10^{21}/cm^3$, such as from $2.0 \times 10^{20}/cm^3$ to $2.0 \times 10^{21}/cm^3$, although lesser and greater average dopant concentrations may also be used. The portion of the second semiconducting metal oxide layer 822 that is not implanted with the atoms of the second n-type dopant constitutes a backside channel region 822M. The species of the second n-type dopant may be the same as, or may be different from, the species of the first n-type dopant.

FIG. 6B illustrates a total n-type dopant concentration profile for the source-side n-doped region 842S or the drain-side n-doped region 842D after the processing steps of FIG. 2J in case the dopant profile illustrated in FIG. 3A is present within the first semiconducting metal oxide layer prior to the processing steps of FIG. 2J.

Figure 6C:
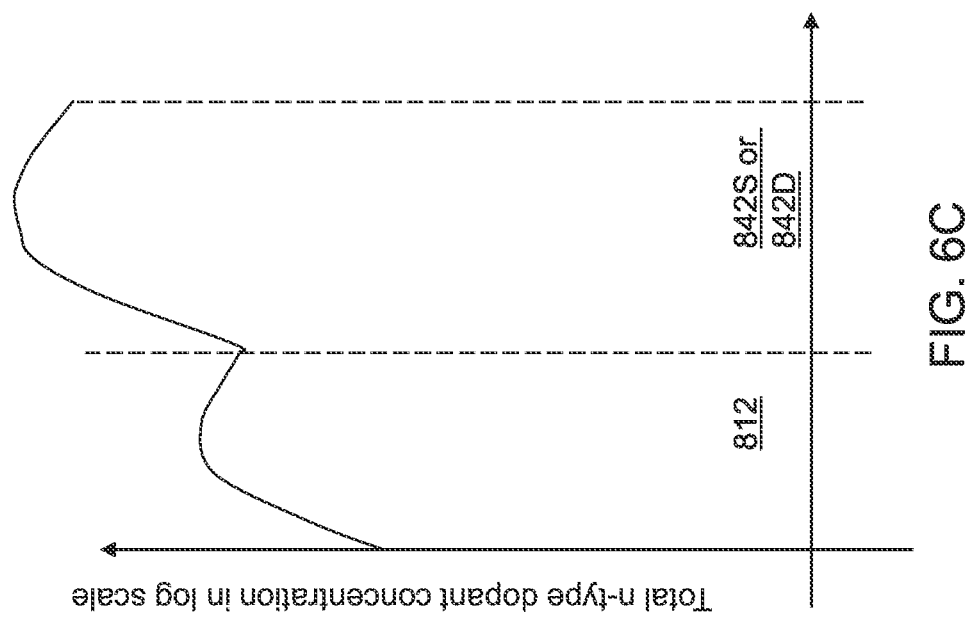
FIG. 6C illustrates a total n-type dopant concentration profile for a source-side n-doped region or a drain-side n-doped region after the processing steps of FIG. 2J in case the dopant profile illustrated in FIG. 3B or the dopant profile illustrated in FIG. 3C is present within the first semiconducting metal oxide layer prior to the processing steps of FIG. 2J.

FIG. 6C illustrates a total n-type dopant concentration profile for the source-side n-doped region 842S or the drain-side n-doped region 842D after the processing steps of FIG. 2J in case the dopant profile illustrated in FIG. 3B or the dopant profile illustrated in FIG. 3C is present within the first semiconducting metal oxide layer prior to the processing steps of FIG. 2J.

Generally, the second semiconducting metal oxide layer 822 includes a backside channel region 822M, a source-side n-doped region 842S, and a drain-side n-doped region 842D. The source-side n-doped region 842S and the drain-side n-doped region 842D are doped with n-type dopants at the second average dopant concentration that is higher than the first average dopant concentration.

Referring to FIG. 2K, a metallic material may be deposited in the source cavity 83S and the drain cavity 83D and over the dielectric cap passivation layer 830 to form a metallic liner layer 86L. The metallic material of the metallic liner layer 86L may include one or more of Co, Ru, Mo, Ti, Ta, TiN, TaN, WN, alloys thereof, compounds thereof, and layer stacks thereof. Other suitable metallic liner materials are within the contemplated scope of disclosure. The thickness of the metallic liner layer 86L may be in a range from 1 nm to 20 nm, such as from 2 nm to 10 nm, although lesser and greater thicknesses may also be used. The metallic liner layer 86L may be deposited directly on physically exposed surfaces of the source-side n-doped region 842S and the drain-side n-doped region 842D.

Referring to FIG. 2L, a metallic fill material may be deposited in remaining volumes of the source cavity 83S and the drain cavity 83D. The metallic fill material may be any metallic material that provides high electrical conductivity. In one embodiment, the metallic fill material may be selected from Cu, Al, Co, Ru, Mo, Mn, Ti, Ta, W, TiN, TaN, an alloy thereof, or a layer stack thereof. Other suitable metallic fill materials may be within the contemplated scope of disclosure.

Excess portions of the metallic fill material and the metallic liner layer 86L may be removed from above the horizontal plane including the top surface of the dielectric cap passivation layer 830 by a planarization process, which may include a chemical mechanical polishing (CMP) process. A remaining portion of the metallic fill material that remains in the source cavity 83S constitutes a source-side metallic fill material portion 87S. A remaining portion of the metallic fill material that remains in the drain cavity 83D constitutes a drain-side metallic fill material portion 87D. A remaining portion of the metallic liner layer 86L in the source cavity 83S constitutes a source-side metallic liner 86S. A remaining portion of the metallic liner layer 86L in the drain cavity 83D constitutes a drain-side metallic liner 86D.

Each contiguous combination of a remaining portion of the metallic liner layer 86L and a remaining portion of the metallic fill material comprises a source structure 88S or a drain structure 88D. Specifically, each contiguous combination of a source-side metallic liner 86S and a source-side metallic fill material portion 87S constitutes a source structure 88S. Each contiguous combination of a drain-side metallic liner 86D and a drain-side metallic fill material portion 87D constitutes a drain structure 88D. Generally, a source structure 88S and a drain structure 88D are provided for each thin film transistor. The source structure 88S comprises a first portion of at least one metallic material and contacts a top surface of the source-side n-doped region 842S of a respective thin film transistor. The drain structure 88D comprises a second portion of the at least one metallic material and contacts a top surface of the drain-side n-doped region 842D of the respective thin film transistor. The source structures 88S and the drain structures 88D provide electrical contact to the source-side n-doped regions 842S and the drain-side n-doped regions 842D for the thin film transistors.

Generally, various metal interconnect structures such as metal lines and metal via structures may be formed as needed. Interlayer dielectric (ILD) materials may be deposited to form various interlayer dielectric material layers, which embed the various metal interconnect structures. The thin film transistors formed using the processing steps of FIGS. 2A-2L may be used for any applications known in the art.

Figure 7:
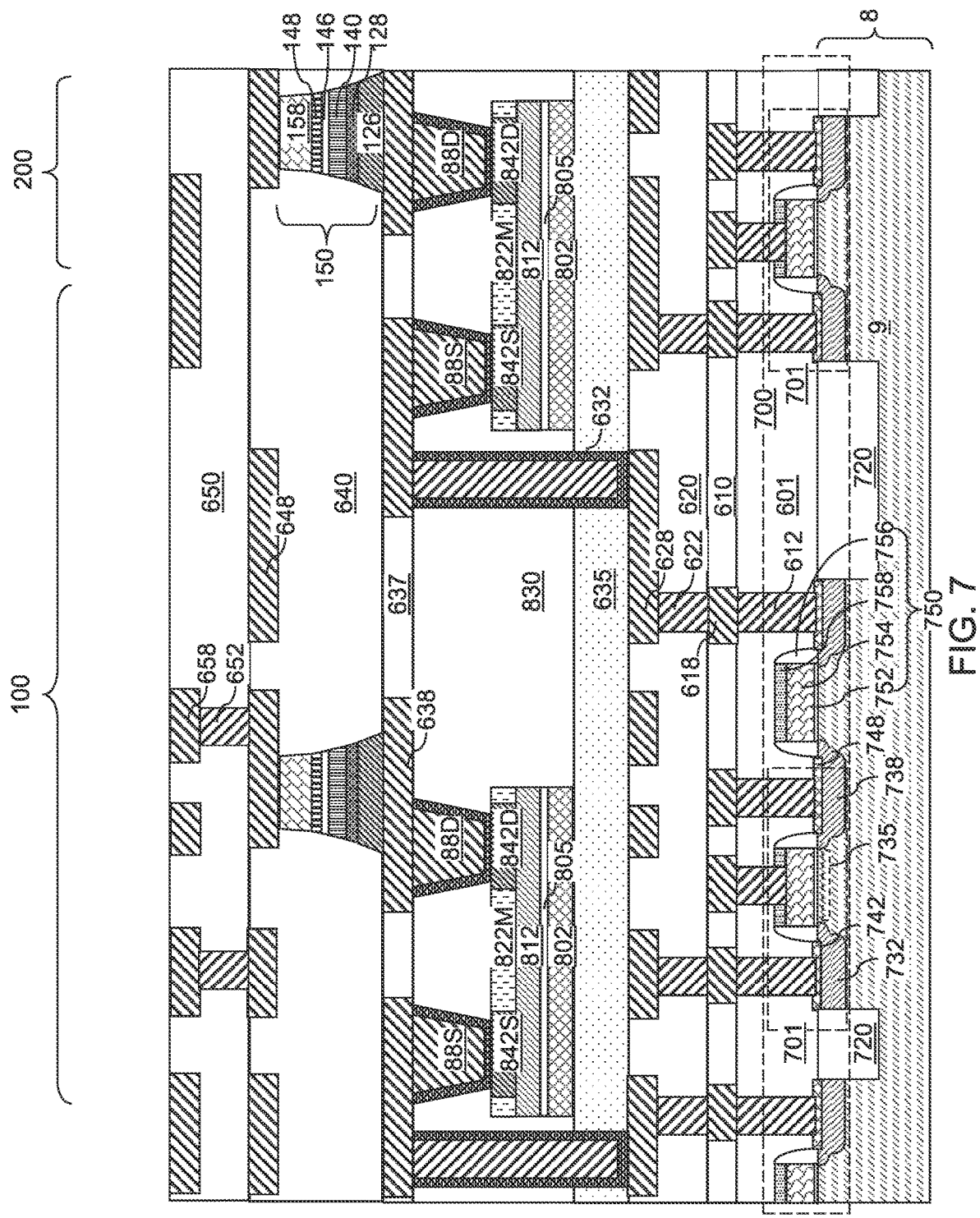
FIG. 7 is a vertical cross-sectional view of the exemplary structure after formation of thin film transistors and memory cells according to an embodiment of the present disclosure.

Referring to FIG. 7, the exemplary structure is illustrated after formation of thin film transistors for an illustrative example, in which memory cells 150 are subsequently formed. Second metal via structures 632 may be formed through the dielectric cap passivation layer 830 and the planar insulating spacer layer 635 on a respective one of the second metal line structures 628 concurrent with, before, or after, formation of the source structures 88S and the drain structures 88D.

A dielectric material layer, which is herein referred to as a third line-level dielectric material layer 637, may be deposited over the dielectric cap passivation layer 830. Third metal line structures 638 may be formed in the third line-level dielectric material layer 637 on a respective one of the metallic structures (88S, 88D, 632) formed within the dielectric cap passivation layer 830.

Additional metal interconnect structures formed within additional dielectric material layers may be subsequently formed over the thin film transistors and the third line-level dielectric material layer 637. In an illustrative example, the dielectric material layers may include, for example, a fourth interconnect-level dielectric material layer 640, a fifth interconnect-level dielectric material layer 650, etc. The additional metal interconnect structures may include third metal via structures (not illustrated) and fourth metal lines 648 formed within the fourth interconnect-level dielectric material layer 640, fourth metal via structures 652 and fifth metal line structures 658 formed within the fifth interconnect-level dielectric layer 650, etc.

Optionally, memory cells 150 may be formed below, above, or at the same level as, the thin film transistors. In embodiments in which the thin film transistors are formed as a two-dimensional periodic array, the memory cells 150 may be formed as a two-dimensional periodic array of memory cells 150. Each memory cell 150 may comprises a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., bottom electrode) and the second electrode 158 (i.e., top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 140, a tunneling barrier layer 146, a free magnetization layer 148, and a second electrode 158.

Figure 8:
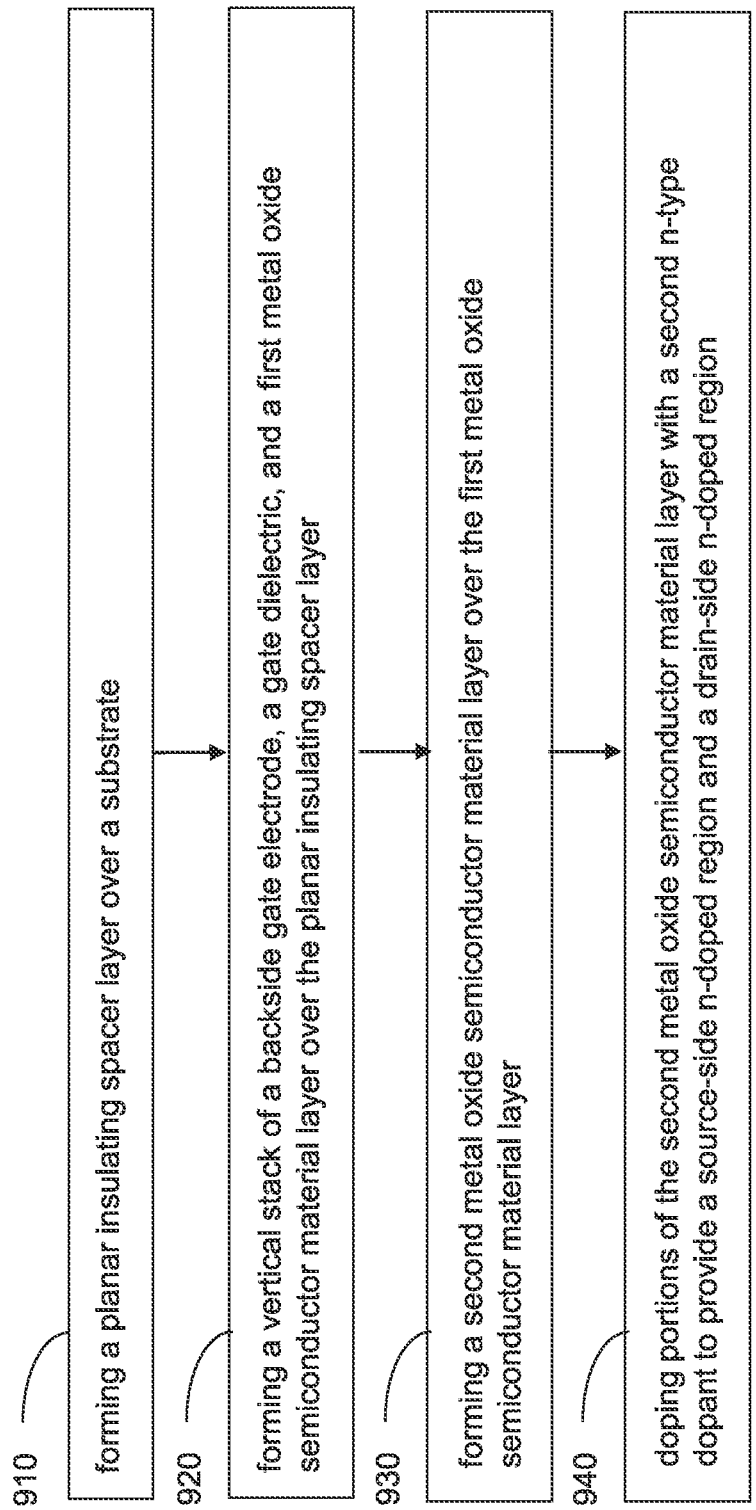
FIG. 8 is a flowchart that illustrates the general processing steps for manufacturing the semiconductor device of the present disclosure.

FIG. 8 is a flowchart that illustrates the general processing steps in a method of forming the semiconductor device of the present disclosure.

Referring to step 910 and FIGS. 1 and 2A, a planar insulating spacer layer 635 may be formed over a substrate 8.

Referring to step 920 and FIGS. 2B-2D and 3A-3C, a vertical stack of a gate electrode 802, a gate dielectric layer 805, and a first semiconducting metal oxide layer 812 is formed over the planar insulating spacer layer 635. The first semiconducting metal oxide layer 812 comprising atoms of a first n-type dopant at a first average dopant concentration.

Referring to step 930 and FIGS. 2E-2H, 4, and 5, a second semiconducting metal oxide layer 822 is formed over the first semiconducting metal oxide layer 812.

Referring to step 940 and FIGS. 2I-2L and 6, portions of the second semiconducting metal oxide layer 822 may be doped with a second n-type dopant to provide a source-side n-doped region 842S and a drain-side n-doped region 842D that include atoms of the second n-type dopant at a second average dopant concentration that is greater than the first average dopant concentration.

Referring to all drawings and according to various embodiments of the present disclosure, a semiconductor structure including a transistor is provided. The transistor includes: a gate electrode 802; a gate dielectric layer 805 located on the gate electrode 802; a first semiconducting metal oxide layer 812 located over the gate dielectric layer 805; and a second semiconducting metal oxide layer 822 located over the first semiconducting metal oxide layer 812 and comprising a backside channel region 822M, a source-side n-doped region 842S, and a drain-side n-doped region 842D, wherein the backside channel region 822M comprises electrically neutral dopants that passivates oxygen deficiency and occupying locations of the oxygen deficiency.

In one embodiment, the electrically neutral dopants include atoms of a species selected from He, Ne, Ar, Kr, and N. In another embodiment, the electrically neutral dopants have a non-uniform vertical concentration profile. In another embodiment, the semiconductor structure may further include: a dielectric cap passivation layer 830 overlying the second semiconducting metal oxide layer 822; a source structure 88S comprising a first portion of at least one metallic material 87S and contacting a top surface of the source-side n-doped region 842S; and a drain structure 88D comprising a second portion of the at least one metallic material 87D and contacting a top surface of the drain-side n-doped region 842D. In another embodiment, the dielectric cap passivation layer 830 may include a dielectric metal oxide including a metal selected from Al, Ga, Hf, and Zr; and the second semiconducting metal oxide layer 822 may be doped with the metal at a non-uniform dopant concentration profile in which an atomic concentration of the metal decreases with a distance from an interface with the dielectric cap passivation layer 830. In another embodiment, the first semiconducting metal oxide layer 812 may include atoms of an n-type dopant at a first average dopant concentration; and the source-side n-doped region 842S and the drain-side n-doped region 842D are doped with n-type dopants at a second average dopant concentration that is higher than the first average dopant concentration. In another embodiment, sidewalls of the gate dielectric layer 805, sidewalls of the first semiconducting metal oxide layer 812, and the sidewalls of the second semiconducting metal oxide layer 822 are vertically coincident with one another.

According to another aspect of the present disclosure, a semiconductor structure including a transistor is provided. The transistor comprises: a gate electrode 802; a gate dielectric layer 805 located on the gate electrode 802; a first semiconducting metal oxide layer 812 located over the gate dielectric layer 805 and comprising atoms of an n-type dopant at a first average dopant concentration; and a second semiconducting metal oxide layer 822 located over the first semiconducting metal oxide layer 812 and comprising a backside channel region 822M, a source-side n-doped region 842S, and a drain-side n-doped region 842D, wherein the source-side n-doped region 842S and the drain-side n-doped region 842D are doped with n-type dopants at a second average dopant concentration that is higher than the first average dopant concentration.

In one embodiment, the gate dielectric layer 805 may include additional atoms of the first n-type dopant at a third average dopant concentration that is greater than the first average dopant concentration. In another embodiment, an atomic concentration of the atoms of the first n-type dopant within the first semiconducting metal oxide layer 812 has a non-uniform vertical concentration profile. In another embodiment, the atomic concentration of the atoms of the first n-type dopant within the first semiconducting metal oxide layer 812 in the non-uniform vertical concentration profile comprises a segment S1 that decreases with a vertical distance from an interface with the gate dielectric layer 805. In another embodiment, the atomic concentration of the atoms of the first n-type dopant within the first semiconducting metal oxide layer 812 in the non-uniform vertical concentration profile comprises a segment S2 that increases with a vertical distance from an interface with the gate dielectric layer 805. In another embodiment, the gate dielectric layer 805 may be free of the first n-type dopant within the first semiconducting metal oxide layer 812, or includes the first n-type dopant within the first semiconducting metal oxide layer 812 at an atomic concentration that is less than 0.1 times the first average dopant concentration. In another embodiment, the first n-type dopant may include a halide species selected from F, Cl, Br, and I.

The various embodiments of the present disclosure provide any one of, or any combination of, features, which includes a first feature of an n-type doping related treatment before deposition of the first semiconducting metal oxide layer 812 (such as the first ion implantation process "I/I 1"), a second feature of an n-type doping related treatment after deposition of the first semiconducting metal oxide layer 812 (such as the second ion implantation process "I/I 2"), a third feature of a neutral treatment after deposition of the second semiconducting metal oxide layer 820, a fourth feature of oxygen vacancy passivation by diffusion of a metallic dopant from a dielectric cap passivation layer 830, and a fifth feature of an n-type doping related treatment after formation of the source cavity 83S and the drain cavity 83D (which forms the source-side n-doped region 842S and the drain-side n-doped region 842D).

According to an aspect of the present disclosure, neutral surface treatment by electrically neutral dopants (such as N, Ar, He, Ne, etc.) may be utilized to passivate oxygen vacancies that generate defect states within the second semiconducting metal oxide layer 822 (which is a back-channel layer). Passivation with the electrically neutral dopants increases electrical bonds between metal atoms and the electrically neutral dopants, and thus, reduces the density of oxygen vacancies within the second semiconducting metal oxide layer 822.

According to another aspect of the present disclosure, an n-type doping treatment using n-type dopants (such as F, Cl, Br, I, etc.) may be performed in the first semiconducting metal oxide layer 812 that directly contacts the gate dielectric layer 805. The n-type doping treatment of the first semiconducting metal oxide layer 812 passivate oxygen vacancy defect states within the first semiconducting metal oxide layer 812, and provides extra free electron to enhance local carrier concentration within the first semiconducting metal oxide layer 812. Thus, the conductance of the active semiconductor channel (812, 822M) of the thin film transistor may be increased. The active semiconductor channel (812, 822M) includes a stack of the first semiconducting metal oxide layer 812 and a backside channel region 822M.

According to yet another aspect of the present disclosure, a high-k dielectric cap passivation process may be utilized, which diffuses a metallic dopant such as gallium (Ga), hafnium (Hf), Aluminum (Al), and/or zirconium (Zr) from the dielectric cap passivation layer 830 into the second semiconducting metal oxide layer 822. The diffusion of the metallic dopant into the active semiconductor channel (812, 822M) may prevent, and/or reduce, formation of oxygen vacancies in the active semiconductor channel (812, 822M) because such metallic dopants may provide high ionic field strengths. In other words, metallic dopant species such as Ga, Hf, Al, and/or Zr causes oxygen atoms to be bound more tightly, and thus, reduces the atomic concentration of the oxygen vacancies within the active semiconductor channel (812, 822M).

The various embodiments of the present disclosure may provide the benefit of leakage current reduction in a backside channel region 822M (which is a back channel) by using carrier suppressors (i.e., metallic dopants that reduce oxygen vacancies that function as charge carriers). Electrical stability under electrical bias conditions and thermal stability may be increased for the thin film transistors of the present disclosure. Further, device performance parameters (such as on-state current, charge carrier concentration, and carrier mobility) may be enhanced for thin film transistors by the n-type doping treatment on the first semiconducting metal oxide layer 812.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure including a transistor, wherein the transistor comprises:
    a gate electrode located over a substrate;
    a gate dielectric layer located on the gate electrode;
    a first semiconducting metal oxide layer located over the gate dielectric layer; and
    a second semiconducting metal oxide layer located over the first semiconducting metal oxide layer and comprising a backside channel region, a source-side n-doped region, and a drain-side n-doped region, wherein the backside channel region comprises electrically neutral dopants that passivates oxygen deficiency and occupying locations of the oxygen deficiency.

2. The semiconductor structure of claim 1, wherein the electrically neutral dopants comprise atoms of a species selected from He, Ne, Ar, Kr, and N.

3. The semiconductor structure of claim 1, wherein the electrically neutral dopants have a non-uniform vertical concentration profile.

4. The semiconductor structure of claim 1, further comprising:
    a dielectric cap passivation layer overlying the second semiconducting metal oxide layer;
    a source structure comprising a first portion of at least one metallic material and contacting a top surface of the source-side n-doped region; and
    a drain structure comprising a second portion of the at least one metallic material and contacting a top surface of the drain-side n-doped region.

5. The semiconductor structure of claim 4, wherein:
    the dielectric cap passivation layer comprises a dielectric metal oxide including a metal selected from Al, Ga, Hf, and Zr; and
    the second semiconducting metal oxide layer is doped with the metal at a non-uniform dopant concentration profile in which an atomic concentration of the metal decreases with a distance from an interface with the dielectric cap passivation layer.

6. The semiconductor structure of claim 1, wherein:
the first semiconducting metal oxide layer comprising atoms of an n-type dopant at a first average dopant concentration; and
the source-side n-doped region and the drain-side n-doped region are doped with n-type dopants at a second average dopant concentration that is higher than the first average dopant concentration.

7. The semiconductor structure of claim 1, wherein sidewalls of the gate dielectric layer, sidewalls of the first semiconducting metal oxide layer, and the sidewalls of the second semiconducting metal oxide layer are vertically coincident with one another.

8. A semiconductor structure including a transistor, wherein the transistor comprises:
a gate electrode;
a gate dielectric layer located on the gate electrode;
a first semiconducting metal oxide layer located over the gate dielectric layer and comprising atoms of a first n-type dopant at a first average dopant concentration;
a second semiconducting metal oxide layer located over the first semiconducting metal oxide layer and comprising a backside channel region, a source-side n-doped region, and a drain-side n-doped region, wherein the source-side n-doped region and the drain-side n-doped region are doped with second n-type dopants at a second average dopant concentration that is higher than the first average dopant concentration.

9. The semiconductor structure of claim 8, wherein the gate dielectric layer comprises additional atoms of the first n-type dopant at a third average dopant concentration that is greater than the first average dopant concentration.

10. The semiconductor structure of claim 8, wherein an atomic concentration of the atoms of the first n-type dopant within the first semiconducting metal oxide layer has a non-uniform vertical concentration profile.

11. The semiconductor structure of claim 10, wherein the atomic concentration of the atoms of the first n-type dopant within the first semiconducting metal oxide layer in the non-uniform vertical concentration profile comprises a segment that decreases with a vertical distance from an interface with the gate dielectric layer.

12. The semiconductor structure of claim 10, wherein the atomic concentration of the atoms of the first n-type dopant within the first semiconducting metal oxide layer in the non-uniform vertical concentration profile comprises a segment that increases with a vertical distance from an interface with the gate dielectric layer.

13. The semiconductor structure of claim 8, wherein the gate dielectric layer is free of the first n-type dopant within the first semiconducting metal oxide layer, or includes the first n-type dopant within the first semiconducting metal oxide layer at an atomic concentration that is less than 0.1 times the first average dopant concentration.

14. The semiconductor structure of claim 8, wherein the first n-type dopant comprises a halide species selected from F, Cl, Br, and I.

15. A method of forming a semiconductor structure, comprising:
forming a planar insulating spacer layer over a substrate;
forming a vertical stack of a gate electrode, a gate dielectric layer, and a first semiconducting metal oxide layer over the planar insulating spacer layer, wherein the first semiconducting metal oxide layer comprising atoms of a first n-type dopant at a first average dopant concentration;
forming a second semiconducting metal oxide layer over the first semiconducting metal oxide layer; and
doping portions of the second semiconducting metal oxide layer with a second n-type dopant to provide a source-side n-doped region and a drain-side n-doped region that include atoms of the second n-type dopant at a second average dopant concentration that is greater than the first average dopant concentration.

16. The method of claim 15, further comprising implanting electrically neutral dopants into the second semiconducting metal oxide layer, wherein the electrically neutral dopants passivates oxygen deficiency within the second semiconducting metal oxide layer.

17. The method of claim 16, further comprising:
forming a dielectric cap passivation layer over the second semiconducting metal oxide layer after implanting the electrically neutral dopants;
forming a source cavity and a drain cavity through the dielectric cap passivation layer; and
implanting ions of the second n-type dopant through the source cavity and through the drain cavity into portions of the second semiconducting metal oxide layer.

18. The method of claim 17, wherein:
the dielectric cap passivation layer comprises a dielectric metal oxide including a metal selected from Al, Ga, Hf, and Zr; and
the method further comprises doping the second semiconducting metal oxide layer with the metal by diffusing atoms of the metal from the dielectric cap passivation layer into the second semiconducting metal oxide layer.

19. The method of claim 15, wherein:
the gate dielectric layer is formed by depositing a dielectric metal oxide material and implanting atoms of the first n-type dopant into the deposited dielectric metal oxide material; and
the method further comprises diffusing the atoms of the first n-type dopant from the gate dielectric layer into the first semiconducting metal oxide layer by performing an anneal process.

20. The method of claim 15, wherein:
the first semiconducting metal oxide layer is deposited over the gate dielectric layer; and
the method further comprises implanting atoms of the first n-type dopant into the first semiconducting metal oxide layer using an ion implantation process.

* * * * *